(12) United States Patent
Fjelstad

(10) Patent No.: US 7,176,580 B1
(45) Date of Patent: Feb. 13, 2007

(54) STRUCTURES AND METHODS FOR WIRE BONDING OVER ACTIVE, BRITTLE AND LOW K DIELECTRIC AREAS OF AN IC CHIP

(76) Inventor: Joseph Fjelstad, 28121 231st Pl. SE, Maple Valley, CA (US) 98038

( * ) Notice: Subject to any disclaimer, the term of this patent is extended or adjusted under 35 U.S.C. 154(b) by 0 days.

(21) Appl. No.: 10/973,172

(22) Filed: Oct. 25, 2004

Related U.S. Application Data

(60) Provisional application No. 60/514,375, filed on Oct. 24, 2003.

(51) Int. Cl.
*H01L 23/08* (2006.01)
*H01L 23/52* (2006.01)
*H01L 29/40* (2006.01)

(52) U.S. Cl. .................. 257/780; 257/780; 257/781; 257/782; 257/783; 257/784

(58) Field of Classification Search ............ None
See application file for complete search history.

(56) References Cited

U.S. PATENT DOCUMENTS

| | | | | |
|---|---|---|---|---|
| 4,000,842 A | * | 1/1977 | Burns | 228/180.21 |
| 5,053,851 A | * | 10/1991 | Berndlmaier et al. | 257/786 |
| 6,020,647 A | * | 2/2000 | Skala et al. | 257/784 |

FOREIGN PATENT DOCUMENTS

JP 64-57741 * 3/1989 ............ 29/827

* cited by examiner

*Primary Examiner*—Jasmine Clark
(74) *Attorney, Agent, or Firm*—Shemwell Mahamedi LLP; Ronald R. Shea, Esq.

(57) ABSTRACT

Disclosed are structures and methods that facilitate the use of wire bonding technology over active areas of an IC chip. The invention is also suitable for use with IC structures that use brittle dielectric materials such as low K dielectrics.

13 Claims, 3 Drawing Sheets

A　　　B

A　　　B

A B

STRUCTURES AND METHODS FOR WIRE BONDING OVER ACTIVE, BRITTLE AND LOW K DIELECTRIC AREAS OF AN IC CHIP

CROSS-REFERENCE TO RELATED APPLICATIONS

This application claims priority from, and hereby incorporates by reference, U.S. Provisional Application No. 60/514,375, filed Oct. 24, 2003 and entitled: "Methods and Structures for Wire Bonding Over Active Areas of an IC Chip." The aforementioned priority application is incorporated by reference in its entirety for all purposes.

FIELD OF THE INVENTION

The present invention relates to the field of electronic interconnections and integrated circuit (IC) packaging technology and more specifically to the methods and structures used to interconnect IC chips to packaging substrates.

BACKGROUND

In the design, manufacture and assembly of semiconductor chips, there has been a well established convention that wire bond pads are placed in a single row at the periphery of the die or in the case of certain chips such as memory devices, in a row in the center of the chip. This is illustrated in FIG. 1. As bond pad counts increase and bond pad pitch becomes too small to reliably bond, changes in design for assembly has become necessary. To relieve some of the pressure caused by the demand for increasing numbers of input and output terminals (I/O), additional rows of peripheral contacts are becoming more common. This is illustrated in FIG. 2. Even so, the continuing reduction of design features on the IC chip continues to drive up I/O counts and thus this may prove to be of only temporary advantage and wire bonding lands may eventually need to be placed over active areas of silicon on the IC. Bonding locations are presently provided over active areas of silicon today for flip chip devices FIG. 3 provides an illustration of examples of area array flip chip bump configurations, however these terminations are not subjected to the rigors of wire bonding.

While flip chip provides the advantage to make connections over active areas of the IC, wire bonding remains a highly desirable method for interconnection due to its greater manufacturing infrastructure and greater versatility. At the present, however, there is a general prohibition against placing wire bonding I/O terminals over active areas of the chip even though it offers a direct connection rather than routing various power ground and signal interconnections to the edge of the chip. In the present situation, however, there are practical reasons for this prohibition based on the fact that the wire bonding process, as currently practiced, will likely damage any active circuitry beneath the bond pad.

Still, there remain significant advantages to making interconnections within the active area of the chip for cost, performance and ease of assembly reasons. It is for these reasons, among others, that flip chip technology was developed. While flip chip technology offers definite advantages in terms of the number of I/O that can be connected and makes available a coarser pitch for I/O terminals, the assembly process can be challenging and reliability issues are an increasing concern due to the mismatch in CTE. Thus, at present, most chip assembly still relies on established wire bonding methods.

Concurrently, with the desire to take advantage of the prospective gains and make reliable wire bonds over active areas of the chip that do not damage the circuitry beneath the contacts, there is a growing need for new methods of wire bonding that do not damage the brittle, low dielectric constant or so-called Low K dielectrics used in advanced IC manufacture. Thus, it would thus be doubly advantageous to allow wire bond pads to be placed any where on the chip to free up area on the surface of the IC.

While attractive conceptually and the object of some earlier experimentation, the potential advantages of wire bonding, over active areas of the chip remains an elusive goal and, to date, so far as is know, a reliable method has, as of yet, been unrealized in production. Also as noted earlier even with peripherally leaded structures, with ever smaller I/O terminals being used and the newer more brittle and easily damaged low dielectric constant insulation materials, the deformation and damage of the subsurface of the IC chip structure is an ever present risk and concern. Thus there exists a need and opportunity to better define structures and methods that will allow the user to make wire connections over active areas of the chip and improve the performance and yield of chip packaging.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description and in the accompanying drawings, specific terminology and drawing symbols are set forth to provide a thorough understanding of embodiments of the invention. In some instances, the terminology and symbols may imply specific details that are not required to practice the invention.

According to an embodiment, an IC chip termination structure is provided that is suitable for making a wire bond over active brittle surface areas. The structure may comprise a wire bond contact configured to overlay the active brittle surface areas without substantially affecting a physical condition of the active brittle surface areas. Additionally, the structure may include a wire bonded to the wire bond contact to provide a termination for the termination structure. By "substantially", what is meant is that the underlying surface is not affected in usability or functionality by the addition of the overlaying material.

Figure 1:
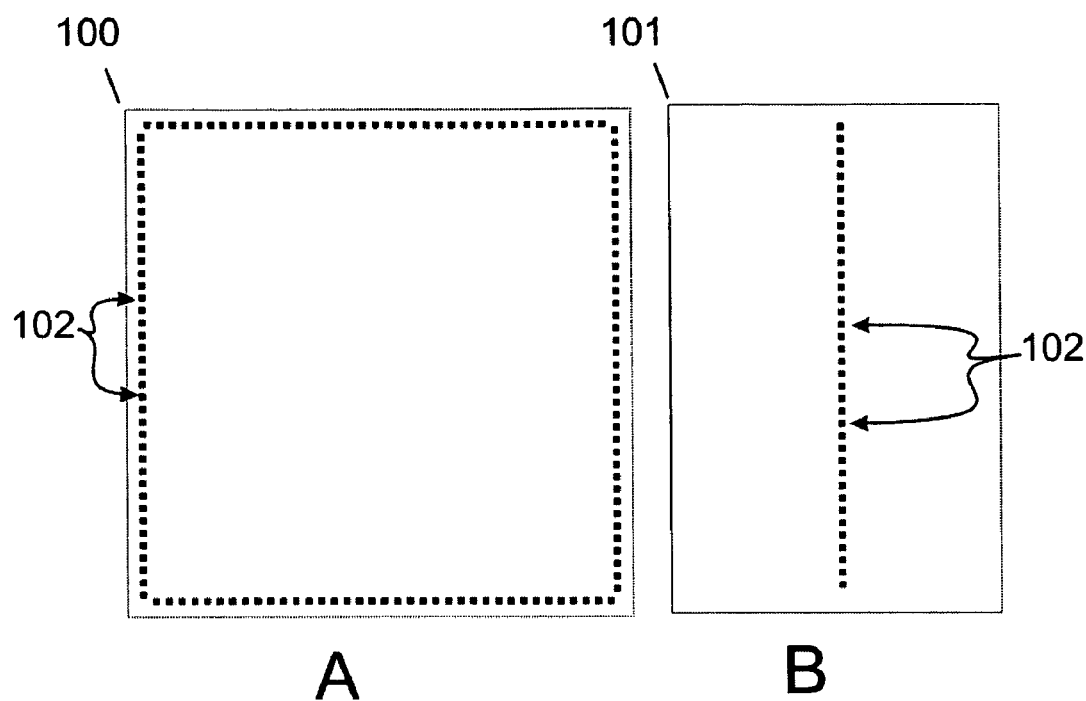
FIGS. 1A and B illustrate traditional prior art layouts for I/O terminations for different IC chip types FIGS. 2A and B illustrate alternative prior art layouts for I/O terminations for different IC chip types.
Figure 2:
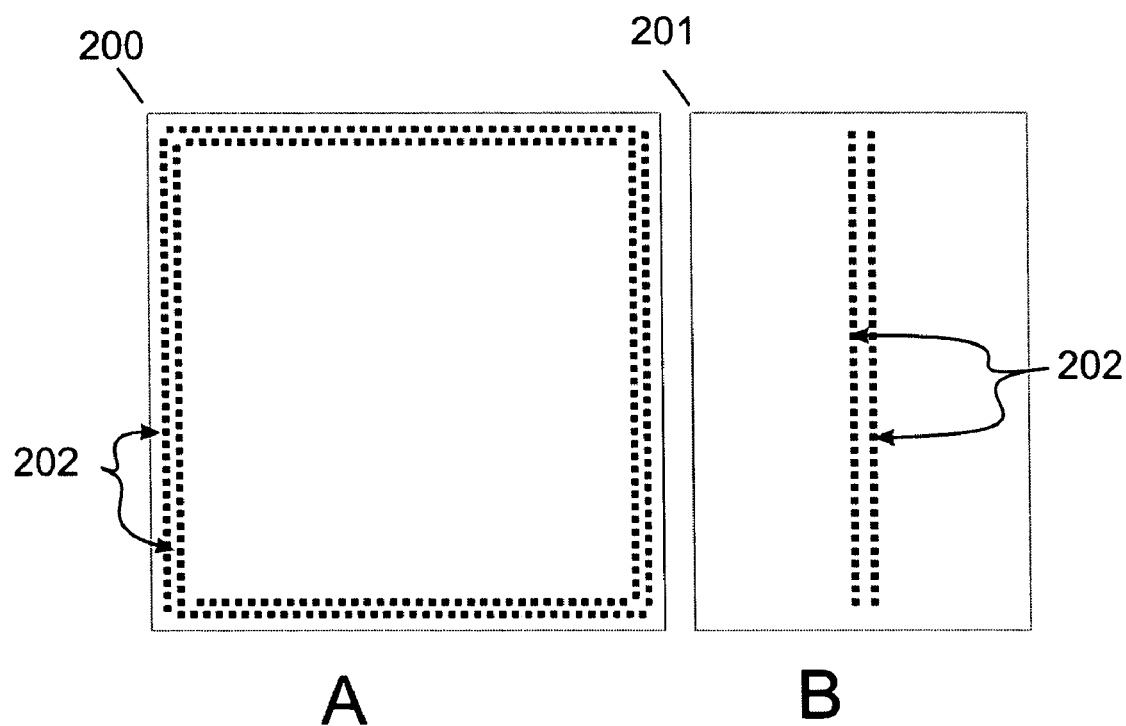
Figure 3:
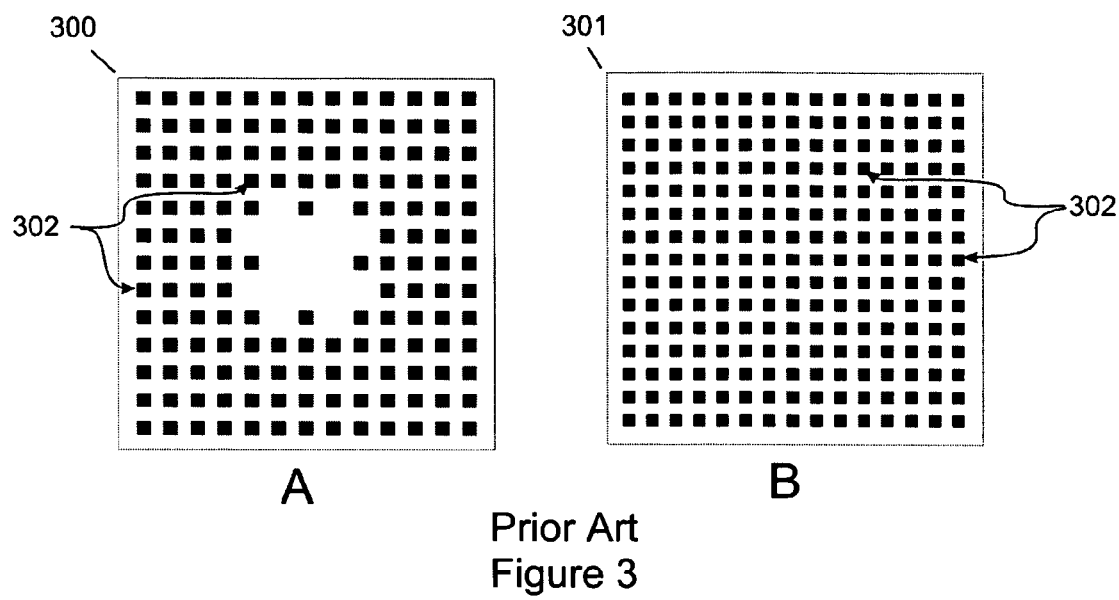
FIGS. 3A and B illustrate representative prior art layouts for I/O terminations for flip chip interconnections.
Figure 4:
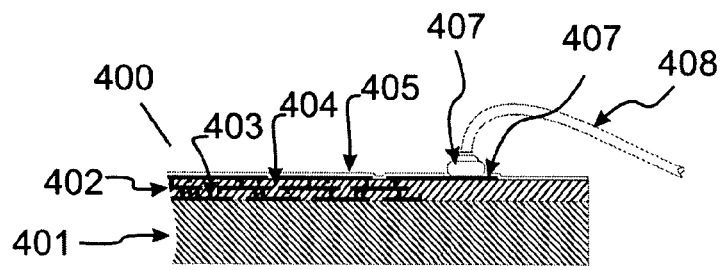
FIG. 4 illustrates in cross section a ball bond connection to an IC bond pad terminal.

Embodiments of the invention allow for the creation of reliable interconnections over active areas of the chip with structures and in a manner that does not damage the underlying circuitry. Fore reference, FIGS. 1 A and B show examples of traditional locations of wire bond pads (102) on chips having peripheral bond pad (100) and center bond pad (101) arrangements, while FIGS. 2 A and B show structures modified peripheral bond pad (200) and center bond pad (201) arrangements that help to address the needs of higher I/O IC chip designs. FIG. 4 illustrates in cross section a partial view of an IC chip (400) its construction which comprises a silicon or other suitable base (401) and a layer of built up circuitry (402) comprised of metal circuits (403), insulating or semiconducting material (404) and a passivation layer (405) representative location of a bond pad (406). A ball bond (407) is typically made although a stitch bond (not shown) is also possible and the wire (408) is connected to the appropriate termination on the IC package or other interconnection structure (not shown). In contrast to the bond pad location structures shown in FIGS. 1 and 2, FIGS. 3A and B illustrate examples of area array terminations for partial I/O termination arrays (300) and for fully populated area array I/O terminations.

While the terminations for the flip chip are disposed to be bonded to in interconnection substrate in a so-called face down configuration, this invention teaches how such structures can be used in a new way with methods that allow for wire bonds to be made over these active areas or over other areas of an IC chip that are vulnerable to damage due to the brittle nature of the IC construction. This is accomplished by using novel, non-standard methods in combination with more traditional tools and techniques. Thus, an objective of the invention is to facilitate the ability of the chip package assembler to make wire bond connections over active areas with little or no disruption of normal design practices and moreover to allow for wire bond interconnections to be made to I/O terminations normally designed for flip chip interconnection.

Figure 5:
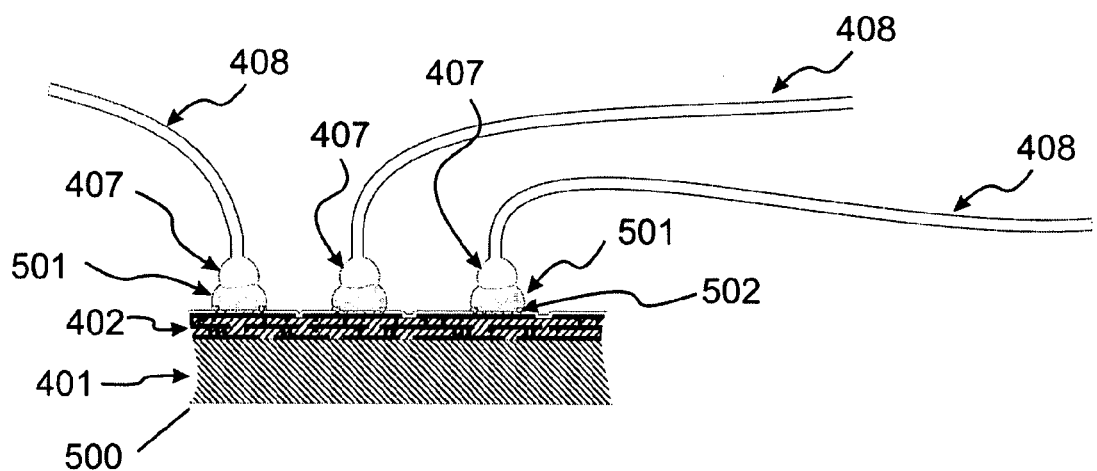
FIG. 5 illustrates in cross section ball bonds over active silicon.

The types of terminations commonly used for making flip chip bump terminations include melting metals and alloys such as solder balls and various forms of electrolessly and electrolytically plated bumps. The bumps may be any elevated or raised portions from the underlying substrate. Terminations on the surface of the chip for practicing the invention can be created directly on the surface in the manner used for the creation of flip chip interconnections such as by plating or sputtering or by placement on the surface using various transfer or dispense and reflow methods. In FIG. 5 a partial cross sectional view of an IC chip (500) having bumps of a suitable material such as a metal or metal alloy (501) which typically resides on a so-called under bump metal or UBM (502). The ball end of the wire (407) is brought into contact with the bump material at a temperature and pressure that do not damage the circuitry beneath the bump but allow a reliable joint to be made. For example a gold or copper bump can be joined to a bump of solder. Ideally as soon as the solder joint is formed, the solder joint will solidify allowing the capillary (not shown) to be withdrawn and the wire routed to its second termination point for connection. While metal bumps are desirable, bumps of conductive polymers could be used and the heat of the capillary could quickly cure the conductive polymer which serves as an adhesive.

Figure 6:
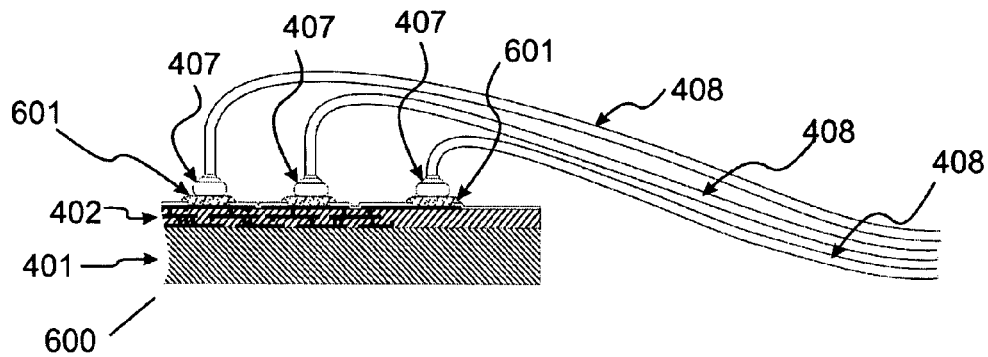
FIG. 6 illustrates ball bonds over active silicon to plated metal bumps

The materials deposited to practice the invention desirably have properties suitable for creating reliable connections both to the pad beneath and the wire joined to them. Many different combinations of wire type and joining medium are possible. The termination, could, for example, be prepared from a relatively soft and/or low melting temperature metal or alloy and the wire joined by a melting and solidification process, however, it is also possible for a hard non melting material, such as a nickel bump as illustrated in FIG. 6. The figure provides a cross sectional view of a portion of an IC chip (600). In the illustration a bump representative and characteristic of that built up by electroless nickel plating is shown (601). The nickel bump would normally be over plated with a bondable finish such as gold metal plating. This provides the bump with a wire bondable surface finish. In such embodiments of the invention, the bump distributes the forces required for wire bonding over a broader area to reduce the potential for fracturing beneath the terminal where the hard bump is located. In normal bonding, the ball as it encounters the bond pad at tangency and has extremely high initial forces that can cause damage thus the use of a thicker more robust bond pad will protect the more delicate original bond that lies beneath.

The prepared terminations of the types described serve to allow the assembler to make interconnection using either standard or modified wire bonders and/or modified bonding practices. Standard bonding wires of gold, copper and aluminum can be used depending on the joining metal and the type of bump used and the joining method chosen based on its suitability relative to the process. In addition, alternative alloys that facilitate the joining process may also prove of value.

Attachment of the wire to the prepared bond pads could be made either by thermal, mechanical, adhesive or ultrasonic joining method depending on the materials used. In any case, the process would either and most desirably require less force and energy to preempt potential damage to the underlying circuitry or the bump itself distribute the forces to protect the die face and its underlying structure.

The larger and thicker base of the terminals, made possible by use of the invention, will provide added protection against damage to the circuitry beneath by spreading the energy over a broader area. However, the choice to use a larger pad would need to be balanced against concerns over the capacitance created.

Figure 7:
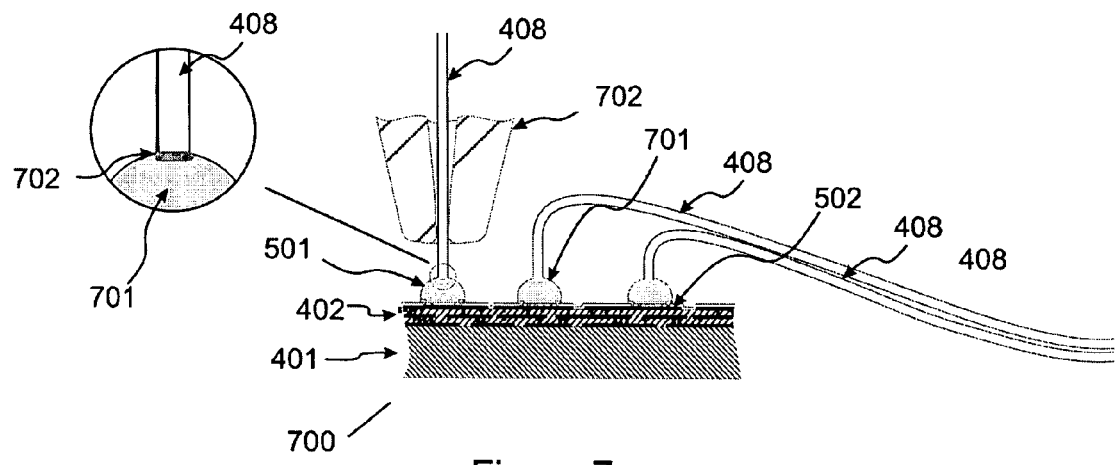
FIG. 7 illustrates a metal wire joined to a bump of a different metallic composition.

Another embodiment of the invention is accomplished by the use of metals and alloys in the creation of the interconnection of bond wire to chip terminal that suitable for the creation of transient liquid phase metal joints. Turning to FIG. 7 where is shown a cross section view of a partial section of an IC chip (700) having bond pads with under bump metallurgy (502) disposed with metal bumps (501) In the process of joining the wire to the bump, the two different suitable metals are brought in contact at an appropriate temperature to effect an interconnection joint. In process of joining the differing metals create an alloy with a melting temperature higher than that of the lowest melting metal or alloy used as one half of the joining pair. For example, and turning back to the figure the metal balls (701) could be made from tin and the bond wires could be made of gold. At elevated temperatures when the two metals are brought into contact with one another, the wire being held in a capillary (703), a transient liquid phase joint that instantly freezes as the gold-tin alloy is formed at the interface (702), as shown in the enlarged area, can be established.

Figure 8:
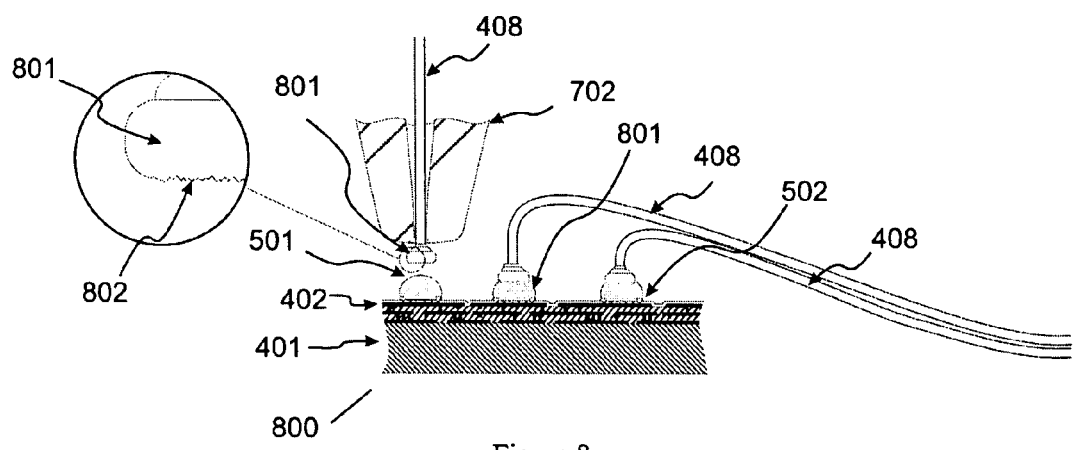
FIG. 8 illustrates a coined ball with micro asperities for making contact and joining

Another embodiment of the invention of the invention is shown in FIG. 8 where the ball is coined before being attached to the bump. The figure shows a cross section view of a portion of an IC chip (800), the ball at the end of the wire is coined (801) before being bonded to the chip termination. A flatter wider termination foot print compliments the wider termination lands being provided and increases the area available for bonding in soldering type applications.

A desirable attribute of the above embodiment is that the ball is coined on a patterned surface to create micro asperities on the bonding surface (802) to increase the average bonding force over a large area on a microscopic scale. The coining operation should not effect bonding however, thus the use of a diamond coated micro-roughened surface as a mandrel is one that would not allow bonding while accomplishing the objective.

Although the invention has been described with reference to specific exemplary embodiments thereof, it will be evident that various modifications and changes may be made thereto without departing from the broader spirit and scope of the invention. The specification and drawings disclosed here are, accordingly, to be regarded in an illustrative rather than a restrictive sense.

What is claimed is:

1. An integrated circuit chip termination structure suitable for making a wire bond over one or more active brittle surface areas of a chip, wherein the integrated circuit chip termination structure comprises:
   a bond pad on a surface of the integrated circuit chip;
   a conductive bump disposed on the bond pad; and
   a wire having a terminal end bonded to the conductive bump, wherein the conductive bump comprises a size configured to spread a compressive force against the surface of the integrated chip during fabrication over an area sufficient to effectively reduce chip damage during fabrication.

2. The integrated circuit chip termination of claim 1, where the conductive bump is formed from a metal.

3. The integrated circuit chip termination of claim 1, where the conductive bump includes a conductive adhesive.

4. The integrated circuit chip termination of claim 2, where the metal comprises tin.

5. The integrated circuit chip termination of claim 2, where the metal comprises a solder alloy.

6. The integrated circuit chip termination of claim 2, where metal comprises copper.

7. The integrated circuit chip termination of claim 2, where metal comprises nickel.

8. The integrated circuit chip termination of claim 7, where the nickel metal is plated with a wire bondable metal.

9. The integrated circuit chip termination of claim 8, where the metal is from the group of noble metals on the periodic chart of elements that includes gold.

10. The integrated circuit chip termination of claim 1, where the chip termination structure comprises transient liquid phase bonding elements.

11. The integrated circuit chip termination of claim 1, where the chip termination structure comprises solder.

12. The integrated circuit chip termination of claim 1, where the chip termination structure comprises adhesive bonding.

13. The integrated circuit chip termination of claim 1, where the terminal end of the wire comprises a coined ball having micro asperities configured to increase a bond strength.

* * * * *